United States Patent [19]
Grundy et al.

[11] Patent Number: 5,041,150
[45] Date of Patent: Aug. 20, 1991

[54] PROCESS FOR COATING GLASS

[75] Inventors: Barry T. Grundy, Wigan; Edward Hargreaves, Merseyside, both of England

[73] Assignees: Pilkington plc, Merseyside, England; Flachglas Aktiengesellschaft, Furth/Bayern, Fed. Rep. of Germany

[21] Appl. No.: 420,368

[22] Filed: Oct. 12, 1989

[30] Foreign Application Priority Data

Oct. 14, 1988 [GB] United Kingdom ............ 8824104

[51] Int. Cl.⁵ .............................. C03C 25/02
[52] U.S. Cl. .................. 65/60.51; 65/60.2; 65/60.5; 118/326; 118/718; 118/719; 427/166; 427/255.2
[58] Field of Search ............ 65/60.1, 60.5, 60.51, 65/60.52, 60.53, 60.8, 254; 427/255.2, 166; 118/718, 719, 326

[56] References Cited

U.S. PATENT DOCUMENTS

| | | | |
|---|---|---|---|
| 3,674,453 | 7/1972 | Loukes et al. | 65/60.51 X |
| 3,850,679 | 11/1974 | Sopko et al. | 65/60.52 X |
| 4,123,244 | 10/1978 | Leclercq et al. | |
| 4,325,987 | 4/1982 | Kalbskopf et al. | |
| 4,524,718 | 6/1985 | Gordon | 118/718 |

FOREIGN PATENT DOCUMENTS

| | | |
|---|---|---|
| 0170216 | 2/1986 | European Pat. Off. |
| 2348166 | 11/1977 | France |
| 1454567 | 11/1976 | United Kingdom |
| 2026454 | 7/1982 | United Kingdom |

Primary Examiner—Robert L. Lindsay
Attorney, Agent, or Firm—Burns, Doane, Swecker & Mathis

[57] ABSTRACT

A process for coating a moving ribbon of hot glass by chemical vapor deposition comprises establishing a first flow of a first reactant gas along the hot glass surface substantially parallel to the direction of movement of the glass, establishing a second flow of a second reactant gas as a turbulent flow at an angle to the glass surface, introducing said second flow into said first flow at said angle, while avoiding upstream flow of said second reactant gas in said first flow, and directing the combined gas flow along the surface of the hot glass as a turbulent flow.

11 Claims, 3 Drawing Sheets

PROCESS FOR COATING GLASS

BACKGROUND OF THE INVENTION

1. Field of the Invention

The invention relates to a method of coating glass and, in particular, to a method of coating glass in which at least two gaseous reactants react together to form a coating on a moving ribbon of hot glass.

2. Description of the Prior Art

It is well known that coatings with desirable properties for architectural use can be produced using gaseous reactants which decompose on the hot glass surface Thus silicon coatings, useful as solar control coatings, have been produced by pyrolysing a silane-containing gas on a hot glass surface, and there have been many proposals to produce other solar control and low emissivity (high infra red reflection) coatings from other appropriate gaseous reactants. Unfortunately, it has proved difficult in commercial practice to achieve sufficiently uniform coatings of the required thickness.

UK patent specification 1 454 377 describes a process in which a gaseous mixture comprising at least one coating reactant is directed through a nozzle at a nozzle exit Reynolds number of at least 2500 against a substrate to be coated. The coating reactant, in a carrier gas, is directed on to the substrate at an angle of 90° to the substrate surface through an elongated nozzle extending across the width of a ribbon of substrate to be coated, and used coating gas is withdrawn through vacuum hoods on either side of the nozzle. The coating gas is not passed parallel to the glass surface and no special provision is made for the use of mixtures of reactants which are liable to react together before reaching the hot glass surface.

According to UK patent specification 1 507 996, a uniform coating is applied from a reactant gas by causing the gas to flow parallel to the glass surface under laminar flow conditions. Again, no specific provisions are made for the use of mixtures of reactants which are liable to react together before reaching the glass surface.

UK patent specification 1 516 032 describes a process of coating glass using a fluid medium, containing one or more coating reactants which may be in liquid or gaseous form, which is directed on to the hot glass as a stream or streams at least one of which has a velocity component in the direction of movement of the ribbon and is inclined to the face of the ribbon at an angle (or mean angle) of not more than 60°. Use of the invention is said to give a coating characterised by a glass-contacting stratum of homogenous structure featuring a regular arrangement of crystals. Where two or more components are required to react together, these may be supplied as separate streams through adjacent nozzles each arranged to provide a stream of reactant at an acute angle to the glass surface so that the reactants come into contact with one another in the vicinity of the glass; or a single nozzle can be used to supply a first stream of reactant while a stream of air, serving as a second reactant, is induced to flow to the reaction zone by the momentum and inclination of the first stream. An exhaust duct may be provided downstream of the coating zone to draw gas away from the coating zone, and a hood may be provided to define, with the glass surface, a flow passage over the glass away from the area of impingement of the fluid stream(s) on the glass.

UK patent specification 1 524 326 describes a process in which a gaseous medium is caused to flow along the substrate to be coated as a substantially turbulence-free layer along a flow passage defined in part by the face of the glass; the flow passage leads to an exhaust ducting via which residual gas is drawn away from the glass. The gaseous reactants are introduced into the flow passage, as in UK patent specification 1 516 032, as streams at an acute angle to the glass.

UK patent specification GB 2 026 454B is particularly concerned with a process for forming a tin oxide coating on a hot glass surface, using a gaseous medium containing tin tetrachloride in a concentration corresponding to a partial pressure of at least $2.5 \times 10^{-3}$ atm and water vapour in a concentration corresponding to a partial pressure of at least $10 \times 10^{-3}$ atm. In a particularly preferred embodiment, a stream of nitrogen carrier gas containing tin tetrachloride vapour is caused to flow along the glass face being coated and a stream of air containing water vapour is delivered into that stream at a position where it is in flow along the said face. A doping agent, such as hydrogen fluoride, can be fed to the substrate face separately, or mixed the moist air. The streams of gas are preferably fed to the glass surface at an acute angle of less than 45°, and caused to flow along the glass as a substantially turbulence-free layer along a flow passage which is defined in part by the face of the glass and which leads to an exhaust ducting by which residual gas is drawn away from the glass.

UK patent specification GB 2 044 137A describes a nozzle for use in directing streams of gaseous reactant onto a hot glass surface to be coated. In order to avoid premature reaction of the coating gases used, for example tin tetrachloride and water vapour, the nozzle includes three adjacent jet ducts each having an exhaust aperture constituted by a rectilinear slot. The jet ducts are arranged side by side with their rectilinear slots parallel and the lateral walls defining the ducts converging towards an imaginary line common to all three ducts. In use the nozzle is arranged with the slots extending across a ribbon of hot glass to be coated with the said imaginary line substantially in the plane of the glass. Discrete laminar streams of reactant flow from the ducts and impinge, along said imaginary line, on the glass. This distance between the nozzle and the glass may be reduced slightly in practice producing a relatively intense local turbulence where the gas streams impact on the glass thereby promoting mixing. Residual gases are drawn away from the coating zone by exhaust ducts upstream and downstream of the nozzle.

UK patent specification GB 2 113 120B describes a modification of the nozzle described in GB 2 044 137A in which the face of the nozzle adjacent the glass is shaped to cause flow of gases from the nozzle preponderantly in the downstream direction. The gaseous flows which are laminar as they leave the jet ducts are deflected in the direction of movement of the glass and substantially parallel to the glass. They thus strike the glass more gently than in the process of GB 2 084 137A, and the degree of turbulence is lowered, which is said to help in reducing the lack of covering which occasionally occurs with the earlier device.

In an alternative technique, from the same inventors as patent specification GB 2 044 137A and described in European patent specification EP 0 060 221, flows of coating gas are caused to run into each other before contacting the substrate either by moving them at different speeds, or by directing them towards each other at an angle greater than 35°, or by a combination of the above, so as to cause an almost instantaneous mixture by virtue of the stirring effect resulting from the shock. In the embodiments described, the reactant gases are delivered through a set of parallel nozzles terminating very close to the glass surface, each comprising a central pipe for a first reactant gas and a second coaxial pipe for a second reactant gas. Baffles in the pipes impart opposed rotational movements to the first and second reactant gases so that the gaseous flows meet at the mouth of the nozzle and the flows are mixed substantially instantaneously before either gas flow contacts the gas. Each nozzle additionally comprises a third pipe coaxial with the first two pipes for removal of used reaction gases from the reaction zone.

In a further method, described in UK patent application GB 2 184 748A, a coating precursor and an oxidising gas are introduced into a mixing zone well above the glass at the upstream end of a coating chamber. Heat is supplied to the mixing zone and the coating precursor and oxidising gas are thoroughly mixed in the mixing zone while exposed to the substrate hut at a height such that coating formation commences from a substantially homogeneous vapour mixture. The mixture is then caused to flow continuously through the coating chamber in contact with the upper face of the glass. It is said to be advantageous for the roof structure to reduce in height in the downstream direction, throttling the flow of vapour along the coating chamber. In some preferred embodiments, the roof structure descends as a curve leading into a downstream roof portion above the glass. This is found to promote a smooth general downstream flow of precursor laden vapour within the coating chamber which is said to be beneficial for the uniformity of the coating formed. Advantageously, the coating chamber has a length of at least 5 meters; the use of such a long coating chamber is said to be of particular benefit in increasing the coating yield when forming relatively thick coatings on a rapidly moving substrate such as a ribbon of freshly formed float glass.

Despite all the prior proposals discussed above, the applicants are not aware of any process employing gases which is used commercially for the production of coatings more than 200 nm thick on a moving ribbon of glass. There is a need for a simple process, which avoids the need for multiple nozzles liable to blockage, capable of producing substantially uniform coatings having a thickness of more than 200 nm from a mixture of gaseous reactants on a hot ribbon of float glass without the need for the long coating chambers referred to above.

SUMMARY OF THE INVENTION

We have now found that relatively thick coatings (200 nm plus) can advantageously be produced in a relatively short coating chamber by a process in which a mixture of reactant gases is caused to flow along the surface of the hot glass in a general direction parallel to the direction of movement of the glass as a turbulent flow.

According to the present invention, there is provided a process for depositing a coating on a moving ribbon of hot glass from at least two gaseous reactants which react together which process comprises (a) establishing a first flow of a first reactant gas along the hot glass surface in a first general direction substantially parallel to the direction of movement of the glass, (b) establishing a second flow of a second reactant gas as a turbulent flow in a second general direction at an angle to said first general direction and to the glass surface, (c) introducing said second flow into said first flow at said angle, while substantially avoiding upstream flow of said second reactant gas in said first flow.

(d) and directing the combined coating gas flow along the surface of the hot glass in said first general direction as a turbulent flow through a coating zone.

The used coating gas from the coating zone is preferably withdrawn away from the hot glass.

Each of the first and second flows may comprise one or more coating reactants and a carrier gas, for example, nitrogen or air, although it is clearly desirable to avoid mixing, within either of the first or second flows, gases which will react together and produce an unwelcome solid deposit on the glass or coating apparatus before the first and second flows mix with each other.

The second flow is provided as a turbulent flow as we have found that this is necessary to achieve a satisfactory degree of mixing with the first flow which is already in contact with the glass. The turbulence of the second flow results in rapid mixing of the two gases and enables a satisfactorily uniform coating to be deposited in a short coating zone as discussed below.

The expression "turbulent flow" used herein means a flow in which fluctuations, which are random in both time and space, in speed and direction are superimposed on the average flow conditions. The required turbulent flow may be achieved by operating at a sufficiently high Reynolds Number (generally at least 2500) or by operating at a somewhat lower Reynolds Number and subjecting the flow to sufficient upstream disturbance to ensure turbulence. While Reynolds Numbers below 2500 may be used, provided the flow is subject to sufficient upstream disturbance, a Reynolds number of at least 1700 will usually be needed to achieve the required turbulence, although turbulent flow can be produced at even lower Reynolds numbers if sufficient shear is applied.

The combined flow will usually be at a Reynolds number of at least 2500, and preferably at least 6000.

Reynolds number, R, is a dimensionless quantity. For a gas flowing through a duct, it may be calculated from the formula, $$\text{Reynolds Number} = W \cdot \sigma \cdot \frac{L}{\eta}$$

where
W = flow velocity of the gas in the duct
σ = density of the gas in the duct
η = dynamic viscosity of the gas flowing in the duct
L = hydraulic diameter of the duct =

$$L = \text{hydraulic diameter of the duct} = \frac{4 \times \text{cross-sectional area of the duct}}{\text{wetted perimeter of duct}}$$

The first flow may be a turbulent flow or a laminar flow. It is preferably co-current with the direction of glass movement and, while it is in a general direction substantially parallel to the direction of movement of the glass, it may converge somewhat towards or diverge somewhat away from the glass. Moreover, it is not essential for the combined flow to be exactly parallel to the glass, for example, the average flow along the glass may converge somewhat towards or diverge somewhat away from the glass, provided it is substantially co-current or countercurrent to the direction of movement of the glass and is in contact with the glass in the coating zone.

Upstream flow of the second reactant gas in the first flow of first reactant gas is to be substantially avoided. Such upstream flow would be liable to result in a non-uniform local deposition of coating material upstream of the location at which the flow of second reactant gas is introduced into the flow of first reactant gas. Thus such upstream flow is to be substantially avoided in order to avoid any local deposition of coating material leading to signficant non-uniformity in the resultant coating.

In order to substantially avoid any upstream flow of the second reactant gas into the first flow, the second flow will preferably be established and introduced into the first flow at an angle of not more than about 90° to the first flow. In practice, it is preferred to use an angle of about 90°, because the use of this angle is found to minimise deposition of coating material in the exit of the duct carrying the second flow while avoiding upstream flow of the second reactant gas into the first flow.

It is found that large scale structural features in the flow, such as roll cells or eddies, are liable to lead to non-uniformity of the coating, and should therefore be avoided. In practice, the use of turbulent flow appears to alleviate such features. They may be further reduced by increasing the rate of the flow of the second reactant gas introduced into the flow of first reactant gas, and/or by operating with the velocity of the combined flow lower than the velocity of the second flow, the gas of the second flow slowing as it is directed along the hot glass surface. On the other hand, small scale structural features, e.g. features having a maximum dimension which is small (say less than 20% and preferably less than 10%) compared to the length of that part of the coating zone in which the majority of the thickness of the coating is deposited, are tolerable without unacceptable departure from uniformity. Thus the small scale features which are inevitable in turbulent flow can be tolerated.

The process of the present invention is especially useful for the production of infra-red reflecting tin oxide coatings using, for example, stannic chloride as the first reactant gas and water vapour as the second reactant gas. To enhance the infra red reflectivity of the coating, a dopant, such as a source of antimony or fluorine, may be included in the reaction gases. Other coatings such as titanium oxide or titanium nitride may also be applied by means of the process of the invention. To apply a titanium oxide coating, titanium tetrachloride may be used as the first reactant gas while water vapour is used as the second reactant gas. To obtain a coating of titanium nitride, titanium tetrachloride may be used as the first reactant gas while ammonia is used as the second reactant gas.

BRIEF DESCRIPTION OF THE DRAWINGS

The invention is illustrated, but not limited, by the following description with reference to the accompanying drawings in which.

In the drawings, like reference numerals refer to like parts.

DETAILED DESCRIPTION OF PREFERRED EMBODIMENTS OF THE INVENTION

In the following description, as in the accompanying claims, the terms "upstream" and "downstream" are used with reference to the direction of flow of reactant gases through the coating chamber. Preferably, as in the specific embodiment to be described by way of example, this is co-current to the direction of glass movement, but this is not necessarily the case and use of the invention may also be advantageous when the direction of flow of reactant gas is countercurrent to the direction of glass movement.

Figure 1:
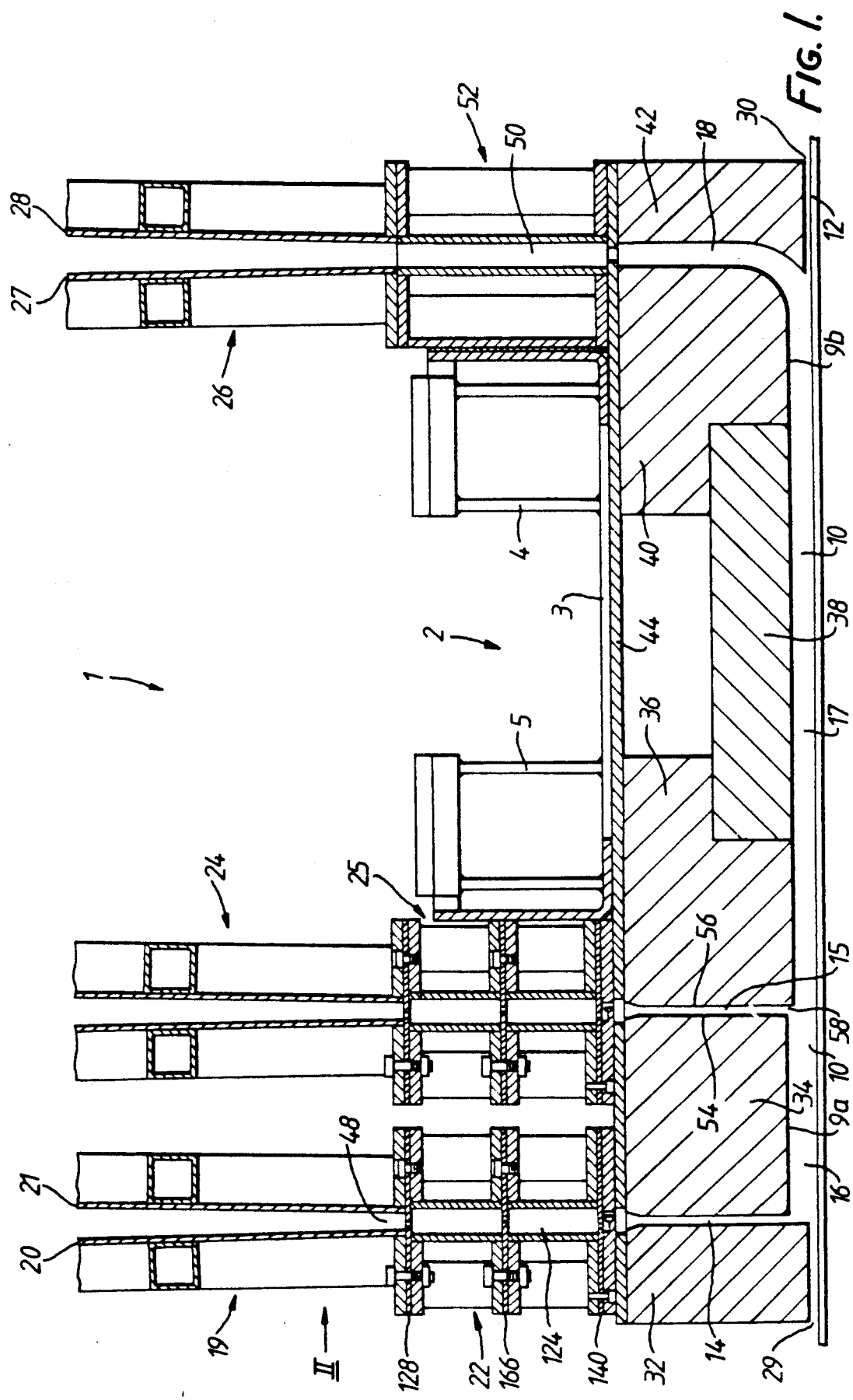
FIG. 1 is a cross sectional side view of an apparatus for use in applying a coating in accordance with the method of the invention.
Figure 2:
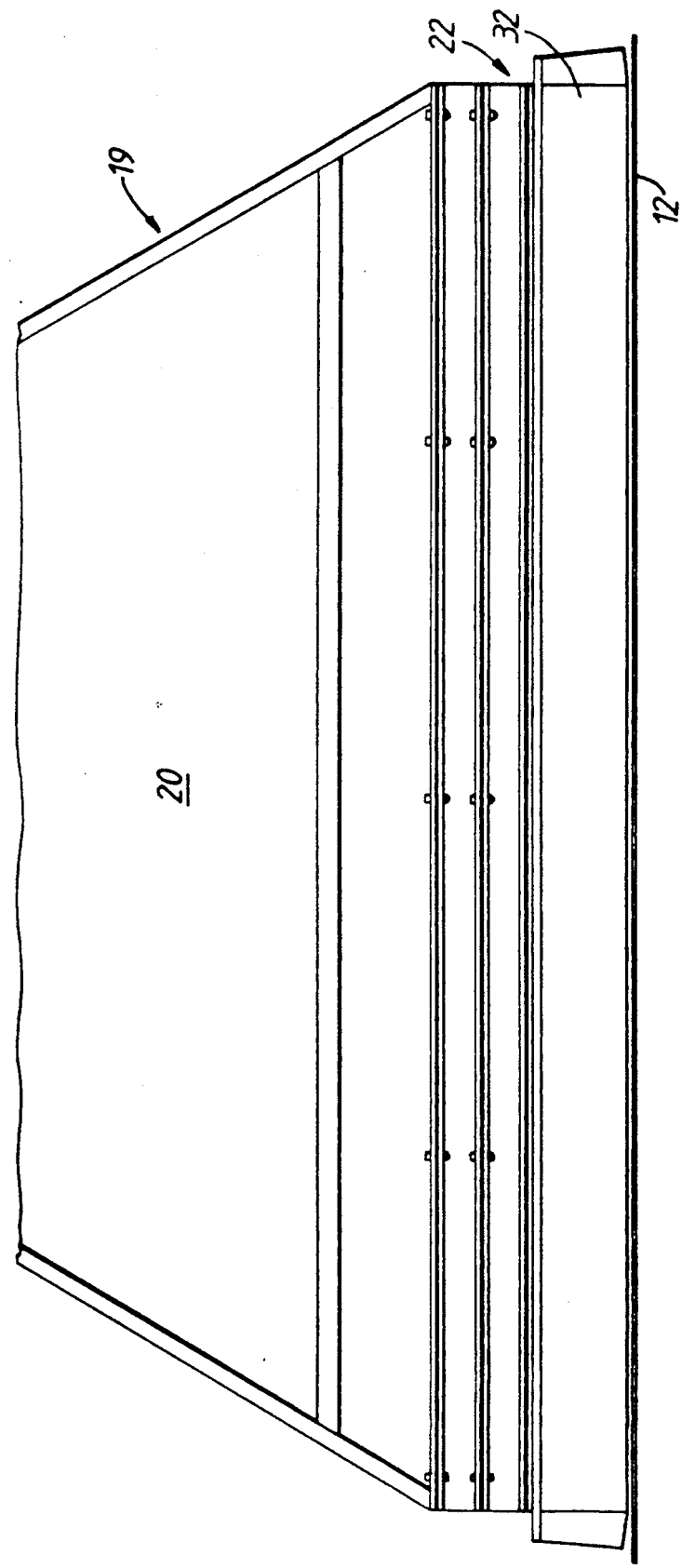
FIG. 2 is an end elevation, taken in the direction of arrow II in FIG. 1, of the apparatus shown in FIG. 1.

Referring particularly to FIGS. 1 and 2, a coating apparatus, generally designated 1, is suspended over a ribbon of glass 12 which is advanced over rollers (not shown) from left to right.

The apparatus is suspended from a carriage 2 comprising a horizontal plate 3, the upper surface of which has welded thereto foreward mounting brackets such as shown at 4 and rearward mounting brackets such as shown at 5. Typically three foreward and three rearward mounting brackets are provided across the width of the coating apparatus; in each case one bracket is mounted centrally and the other two brackets are mounted near the sides of the apparatus. Each of the mounting brackets 4, 5 is suspended from a respective water cooled beam (not shown) which extends across the width of the ribbon of glass to be coated.

The lower part of the apparatus comprises a number of shaped carbon blocks 32, 34, 36, 38, 40 and 42 which extend transversely for a length corresponding to the width of the glass surface to be coated. The carbon blocks define, with the glass surface, a coating chamber 10 having a ceiling 9a, 9b of stepped configuration, with the ceiling 9a of the coating chamber 10 upstream of the second inlet channel 15 being higher than the ceiling 9b of the coating chamber downstream of the second inlet channel 15. The said carbon blocks also define a vertical first inlet channel 14 for the introduction into the coating chamber of a first reactant gas, a vertical second inlet channel 15 for the introduction into the coating chamber of a second reactant gas, a flow path 16 in the coating chamber between the first inlet channel and the second inlet channel, an exhaust channel 18 for removal of used gases from the coating chamber, and a coating zone 17 constituted by the flow path in the coating chamber 10 between the second inlet channel 15 and the exhaust channel 18.

Each of the various carbon blocks is suspended below a horizontal plate member 44. The blocks incorporate ducts (not shown) for a heat transfer fluid such as cooling water, and in use of the apparatus, the temperature of carbon blocks is regulated by passing cooling water through these ducts.

The coating chamber 10 has an open face extending across the ribbon of glass 12 to be coated. At the upstream end of the coating chamber, carbon blocks 32 and 34 define the said vertical first inlet channel 14 through which a first gaseous reactant is introduced into the chamber. Downstream of the first inlet channel, a second vertical inlet channel 15 is defined between carbon blocks 34 and 36 for introducing a second gaseous reactant into the coating chamber.

At the downstream end of the coating chamber, carbon blocks 40 and 42 define an exhaust channel 18 for the removal of used gases from the coating chamber.

The first reactant gas is fed to the first inlet channel 14 from a gas supply duct (not shown) through a fantail distributor 19 and a gas flow restrictor 22. The fantail distributor is defined between front and back walls 20 and 21 in the shape of inverted fans, with the front and back walls converging towards one another in a downward direction to form at the bottom of the fantail a narrow slot 48 extending across the width of the glass ribbon to be coated.

The first reactant gas issuing from the slot 48 at the base of the fantail 19 is passed through a gas flow restrictor 22 which is mounted below the fantail 19.

Figure 3:
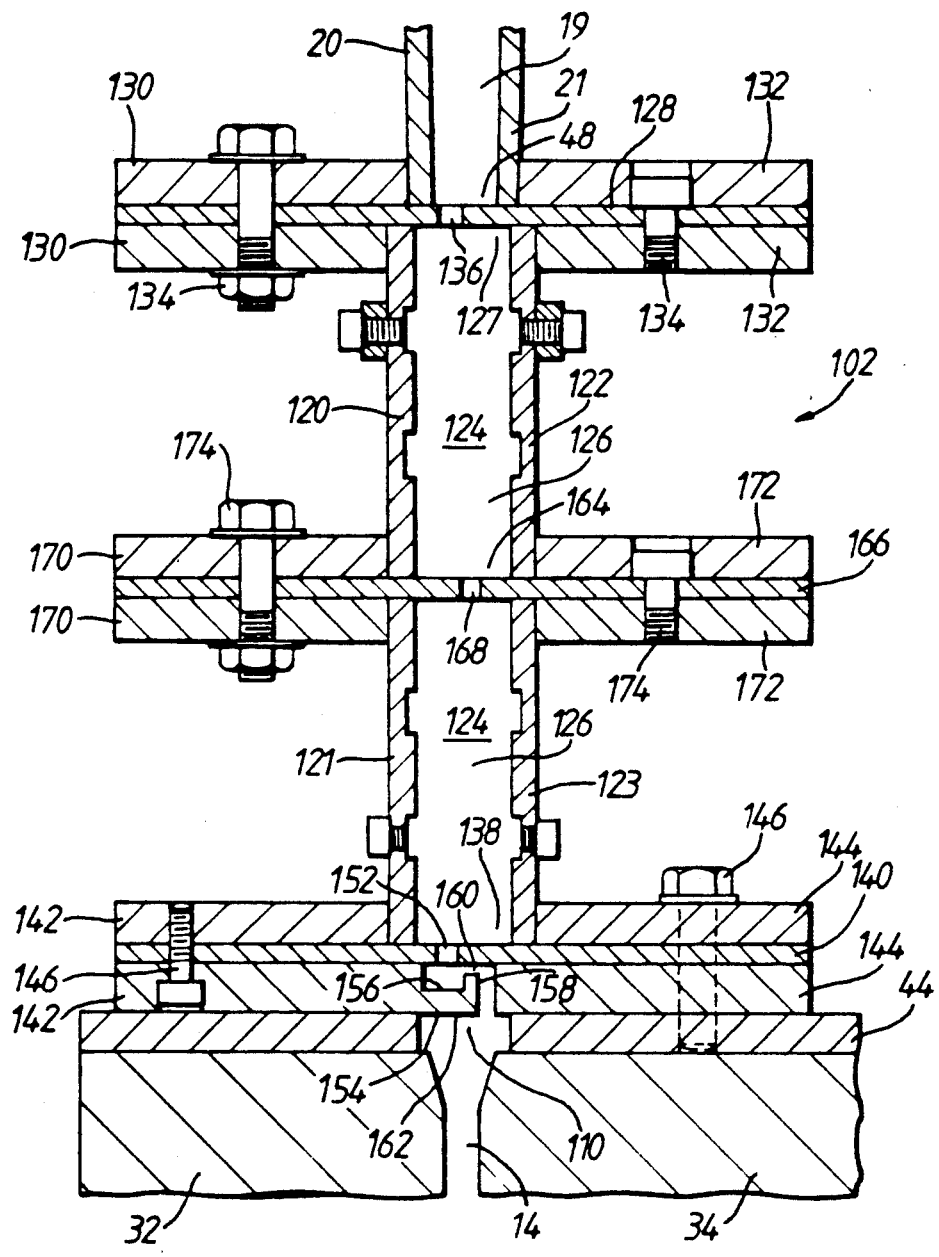
FIG. 3 is a cross-sectional side view showing in greater detail a gas flow restrictor of the type incorporated in the apparatus of FIG. 1.

The gas flow restrictor 22 is illustrated in more detail in FIG. 3 and comprises pairs of opposed elongate walls 120, 122 and 121, 123 which define an elongate chamber 124. The elongate walls 120, 122 and 121, 123 extend transversely across the ribbon of glass being coated, walls 120 and 121 being upstream walls and walls 122 and 123 being downstream walls. Opposed end walls 126 are provided at each end of the elongate chamber 124, each end wall 126 being disposed parallel with the direction of movement of the ribbon of glass.

At the inlet end of the gas flow restrictor 22 there is an inlet restriction 127 comprising an inlet elongate plate member 128 which extends across the chamber 124. The inlet plate member 128 is sealingly fixed between opposing pairs of horizontal plates 130, 132, each pair of plates 130,132 being attached e.g. by welding, to a respective elongate wall 120, 122 and to the fantail distributor 19. The plates of each pair 130, 132 are tightly connected together by threaded connectors 134. Gaskets (not shown) are disposed between of each pair of plates 130, 132 and the inlet plate member 128.

A row of apertures 136 is provided along the length of the inlet plate member 128, the apertures 136 connecting the inlet end of the gas flow restrictor with the remainder of the chamber 124. The apertures 136 are circular holes and preferably have a diameter of from 2 mm to 10 mm. In one particularly preferred embodiment, the holes 136 have a diameter of 4 mm and have centres spaced 20 mm apart. The row of holes 136 is disposed on an upstream side of the elongate chamber 124 i.e. the row of holes 136 is nearer to the upstream wall 120 than to the downstream wall 122 of the chamber 124.

Adjacent the outlet 110 of the gas flow restrictor 22 is disposed an outlet restriction 138. The outlet restriction 138 is of substantially the same construction as the inlet restriction 127 in that it comprises an outlet elongate plate member 140 which is sealingly fixed between two opposing pairs of plates 142, 144 the upper plate of each of said pairs of plates 142, 144 being connected, e.g. by welding, to a respective elongate wall 121, 123. The plates 142, 144 are separated from the outlet plate member 140 by gaskets (not shown). The plates 142, 144 are tightly connected together by threaded connectors 146 which also firmly attach the plates 142, 144, and thereby the gas flow restrictor 22, to plate 44 from which the graphite blocks 32, 34 are suspended. The outlet plate member 140 is provided with a row of holes 152 which preferably have a diameter of from 2 mm to 10 mm and, in one particular preferred embodiment, have a diameter of 4 mm and centres spaced 10 mm apart. The row of holes 152 is disposed on the upstream side of the elongate chamber 124.

A gas flow deflector 154 is mounted at the outlet 110 of the gas flow restrictor 22 below the outlet plate member 140. The gas flow deflector 154 comprises an elongate L-shaped member 156 which is integral with one of the flanges 142 and is disposed adjacent the holes 152. The free arm 158 of the L-shaped member 156 extends upwardly towards the outlet plate member 140 to define therebetween a gap 160 through which reactant gas from the holes 152 must pass after having been deflected by the horizontal arms 162 of the L-shaped member 156.

The purpose of the gas flow deflector 154 is to remove certain localised increases in gas flow which may occur. Thus there is a tendency for the gas flow to be more intense in the immediate vicinity of each of the holes 152 in the outlet plate member 140 below the plate member 140. The presence of the gas flow deflector 154 evens out these localised increased intensities of flow. In some instances it may be possible to omit the gas flow deflector 154 from the gas flow restrictor of the invention.

An intermediate restriction 164 is disposed between the inlet and outlet restrictions 127, 138. The intermediate restriction 164 has the same construction as the inlet restriction 127 and comprises an intermediate elongate plate member 166 with a row of holes 168. The intermediate plate member 166 is sealingly fixed between opposing pairs of horizontal plates 170, 172 which are attached, e.g. by welding, to the elongate walls 120, 121 and 122, 123 respectively. Gaskets (not shown) are disposed between the plates 170, 172 and the intermediate plate member 166 and the plates 170, 172 are tightly connected together by threaded connectors 174. The row of holes 168 of the intermediate plate member 166 is, in contrast to the inlet and outlet plate members 128, 140, disposed on a downstream side of the elongate chamber 124, i.e. the row of holes 168 is nearer to the downstream walls 122, 123 than to the upstream walls 120, 121 of the chamber 124. This arrangement results in the row of holes of adjacent elongate plate members being out of line with each other.

The second reactant gas is fed to the second inlet channel 15 from a second gas supply duct (not shown) through a further fantail distributor 24 which is of the same construction as fantail distributor 19 and then through a gas flow restrictor 25 which is of the same construction as gas flow restrictor 22.

Exhaust gases issuing from exhaust channel 18 pass through a channel 50 in a spacer unit 52 and then into an exhaust fantail 26 comprising inverted fan-shaped front and rear walls 27 and 28. The exhaust fantail conveys waste gases, unreacted reactant gases and carrier gases to an exhaust duct (not shown).

The respective heights of carbon blocks 32, 34 and 36 which define the first inlet channel 14 and the second inlet channel 15 are chosen so that the ceiling $9a$, $9b$ of the coating chamber 10 is provided with a stepped configuration at the juncture of the second inlet channel 15 and the coating chamber, the ceiling $9a$ of the chamber 10 on the upstream side of the second inlet channel 15 being at a higher level than the ceiling $9b$ of the coating chamber on the downstream side of the second inlet channel 15, and as will be seen from FIG. 1, the line described by a longitudinal cross-section taken through the ceiling being discontinuous and having a stepped configuration. Thus the bottom of the block 36 may be chosen to be 10 mm lower than the bottom of block 34. As a result, the base of the upstream wall 54 of the second inlet channel may be 10 mm higher than the base of the downstream wall 56 of the second inlet channel 15 thereby forming an inlet slot 58 having a stepped configuration. Such a stepped inlet slot 58 is found to minimize the amount of solid coating material deposited on the side walls of the second inlet channel 15 in the vicinity of the inlet slot 58. The upstream lower corner of carbon block 36 may be formed with a convex curve (not shown), for example having a radius of curvature of 10 mm for a stepped inlet slot 58 with a step which is 10 mm in height.

In use, the coating apparatus of the invention is suspended over a ribbon of glass 12 which is advanced over rollers (not shown) from left to right. The coating apparatus is suspended at a height over the glass ribbon which is such that the carbon block 42 at the downstream end of the apparatus is held at a height of the order of 10 mm above the surface of the ribbon of glass to be coated. A first reactant gas, generally diluted in a carrier gas, is fed to fantail distributor 19 and gas distributor 22 which provides uniform distribution of the gas across the width of the glass to be coated. The gas emanating from the gas restrictor 22 passes through first inlet channel 14 and into the coating chamber 10 and travels in a first general direction parallel to the glass along flow path 6 in the chamber 10 towards the base of the second inlet channel 15. The second reactant gas, generally diluted in a carrier gas, is fed to fantail distributor 24 and gas restrictor 25 so as to ensure that a uniform distribution of the second gaseous reactant across the width of the glass is obtained.

The second reactant gas, including any carrier gas, is fed to the fantail distributor 24 at a sufficient rate to ensure a turbulent flow of the reactant gas from the second inlet channel 15 into the stream of the first reactant gas in the coating chamber, and the relative rates of the first and second flows are selected to avoid upstream flow of the second reactant gas in the first flow. The combined gas flow is directed as a turbulent flow over the glass surface through coating zone 17 where the two reactant gases react to deposit a coating on the hot glass surface. The carrier gases, unreacted reactant gases and waste gases from the reaction are withdrawn from the coating zone away from the hot glass through exhaust duct 18 by means of reduced pressure (e.g. suction from an exhaust fan—not shown) applied through exhaust fantail 26, comprising upwardly divergent, inverted fan shaped front and back walls 27, 28. The reduced pressure not only draws gas away from the coating zone, but may also induce a flow of external atmosphere under the upstream and downstream extremities (29,30) of the coating apparatus.

The first flow of first reactant gas, introduced through the first inlet channel 14, may be turbulent or laminar.

The use of a coating chamber which has a ceiling with a stepped configuration where the second inlet channel enters enables the apparatus be operated for prolonged periods of time without undesired blockage of the second inlet channel occuring as a result of deposition of coating material in the inlet channel. The use of the method and apparatus described above to apply a fluorine doped tin oxide coating to a hot glass ribbon will now be described by way of example.

EXAMPLE 1

A ribbon of 4 mm float glass, was advanced beneath a coating apparatus as illustrated in FIGS. 1 to 3 at a ribbon speed of 540 meters per hour. The coating apparatus was located before the entrance to the annealing lehr and the glass temperature beneath the coating apparatus was 580° C. A first reactant gas comprising stannic tetrachloride in preheated dry air at 354° C. as a carrier gas was supplied to the inlet of fantail 19. The stannic chloride was supplied at a rate of 84 kilograms per hour, and the dry air was supplied at a rate of 105 cubic meters (measured at NTP) per hour. The first reactant gas passed through the fantail distributor 19 and gas flow restrictor 22 which distributed the gas across the width of the coating chamber 10 to provide a substantially uniform flow of the first reactant gas across the width of the coating chamber to the inlet channel 14. The gas exiting from inlet channel 14 combined with a flow of air induced under upstream toe 29 and flowed in a first general direction parallel to the glass along the flow path 16 towards the second inlet channel 15 and coating zone 17. The Reynold's number of the gas exiting from inlet channel 14 was calculated as 1300.

A second reactant gas comprising 20% hydrofluoric acid in preheated air at a temperature of 402° C. was supplied to the inlet of fantail 24. The hydrofluoric acid was supplied at the rate of 34 kilograms per hour, and the air was supplied at a rate of 620 cubic meters (measured at NTP) per hour. The second reactant gas passed through the fantail distributor 24 and gas flow restrictor 25 which distributed the gas across the width of the coating apparatus to provide a substantially uniform flow of the second reactant gas across the width of the coating apparatus to the inlet channel 15. The gas exited from the second inlet channel as a turbulent flow and combined with the first flow of first reactant gas established over the glass surface. The Reynolds number of the gas exiting from inlet channel 15 was calculated as 4750.

On introduction of the second flow of gas from inlet channel 15 into the established flow from inlet channel 14 along flow path 16, the reactant gases mix rapidly to provide a combined flow through the coating chamber 10. The Reynolds number of the combined flow through the coating chamber was calculated as 7600, allowing for the effect of gas flow induced under upstream toe 29. Upstream flow of the second reactant gas in the first flow of first reactant gas was avoided by limiting the rate of the second flow through inlet channel 15 and maintaining sufficiently high rate of extraction through exhaust channel 18.

The used coating gas was withdrawn away from the hot glass through exhaust channel 18 and fantail 26 by application of reduced pressure (7.5 millibar below atmospheric) at the head of fantail 26.

The process described was found to result in a reasonably uniform fluorine doped tin oxide coating of average thickness 270 nm, and a thickness range of 250 nm to 275 nm (except at the edges), using a relatively short coating zone 17 about 75 cm long between inlet channel 15 and exhaust channel 18. The coated glass exhibited irridescent reflection colours, which could, in view of the narrow range of coating thickness variation ($\pm 5\%$) readily be suppressed by the use of a colour suppression under layer in accordance with UK patent specification GB 2 199 848A.

EXAMPLE 2

The procedure of Example 1 was repeated with the following modifications. In the first reactant gas, the stannic tetrachloride was supplied at a rate of 74 kilograms per hour, and preheated dry air at 300° C. was supplied at a rate of 180 cubic meters (measured at NTP) per hour. The Reynold's number of the gas exiting from the inlet channel 14 was calculated as 1900. The second reactant gas comprised steam in addition to 20% hydrofluoric acid and preheated air at a temperature of 250° C. The steam was supplied at a rate of 120 kilograms per hour, the hydrofluoric acid at a rate of 35 kilograms per hour and the air at a rate of 576 cubic meters (measured at NTP) per hour. The Reybolds number of the gas exiting from inlet channel 15 was calculated as 6100 and the Reybold's number of the combined flow through the coating chamber was calculated as 8400. The reduced pressure used to withdraw the used coating gas away from the glass surface was 5 millibars below atmospheric.

The process described was found to result in a reasonably uniform fluorine doped tin oxide having a thickness in the range 303 nm to 320 nm. The coated glass exhibited a green irridescent reflection colour which, in view of the narrow range of coating thickness variation, could readily be suppressed by the use of a colour suppression underlayer in accordance with UK Pat. No. GB 2 199 848A.

It may thus be seen that the present invention enables a relatively thick (200 nm plus) coating to be deposited with a satisfactory degree of uniformity in a coating zone which may be less than 2 meters in length and is preferably less than 1 meter in length.

We claim:

1. A process for depositing a coating on a moving ribbon of hot glass from at least two gaseous reactants which react together which process comprises
    (a) establishing a first flow of a first reactant gas along the hot glass surface in a first general direction substantially parallel to the direction of movement of the glass,
    (b) establishing a second flow of a second reactant gas as a turbulent flow in a second general direction at an angle to said first general direction and to the glass surface,
    (c) introducing said second flow into said first flow at said angle, while avoiding upstream flow of said second reactant gas in said first flow, and
    (d) directing the combined gas flow along the surface of the hot glass in said first general direction as a turbulent flow through a coating zone.

2. A process according to claim 1 comprising the step of withdrawing the used coating gas from the coating zone away from the hot glass.

3. A process according to claim 1 in which the second general direction is at an angle of about 90° to said first general direction and to the glass surface.

4. A process according to claim 1 wherein the combined flow is at a Reynolds number of at least 6000.

5. A process according to claim 1 in which the first reactant gas comprises stannic chloride.

6. A process according to claim 1 in which the second reactant gas comprises water vapour.

7. A process according to claim 6 wherein hydrogen fluoride is used in admixture in the second reactant gas.

8. A process according to claim 1 wherein the combined flow is directed through the coating zone under the influence of reduced pressure at the downstream end of the coating zone.

9. A process for depositing a coating on a moving ribbon of hot glass from at least two gaseous reactants which react together which process comprises
    (a) establishing a first flow of a first reactant gas along the hot glass surface in a first general direction substantially parallel to the direction of movement of the glass,
    (b) establishing a second flow of a second reactant gas as a turbulent flow in a second general direction at an angle to said first general direction and to the glass surface,
    (c) introducing said second flow into said first flow at said angle, while avoiding upstream flow of said second reactant gas in said first flow,
    (d) directing the combined gas flow along the surface of the hot glass in said first general direction as a turbulent flow through a coating zone,
    (e) and thereafter withdrawing the used coating gas from the coating zone away from the hot glass.

10. A process according to claim 9 in which the second general direction is at an angle of about 90° to said first general direction and to the glass surface.

11. A process according to claim 9 wherein the combined flow is directed throught the coating zone under the influence of reduced pressure at the downstream end of the coating zone.

* * * * *

UNITED STATES PATENT AND TRADEMARK OFFICE
CERTIFICATE OF CORRECTION

PATENT NO. : 5,041,150
DATED : August 20, 1991
INVENTOR(S) : Barry T. Grundy, Edward Hargreaves and Klaus Franz It is certified that error appears in the above-identified patent and that said Letters Patent is hereby corrected as shown below:

On the Title page:

[75]   Inventors:

add   -- Klaus Franz, Wesel, Federal Rupublic of

Germany--

Signed and Sealed this

Twenty-seventh Day of April, 1993

*Attest:*

MICHAEL K. KIRK

*Attesting Officer*    *Acting Commissioner of Patents and Trademarks*